United States Patent
Croon et al.

(10) Patent No.: US 11,664,447 B2
(45) Date of Patent: May 30, 2023

(54) SEMICONDUCTOR DEVICE AND A METHOD OF MAKING A SEMICONDUCTOR DEVICE

(71) Applicant: Nexperia B.V., Nijmegen (NL)

(72) Inventors: Jeroen Croon, Waalre (NL); Coenraad Cornelis Tak, San Jose, CA (US)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/336,763

(22) Filed: Oct. 27, 2016

(65) Prior Publication Data
US 2017/0133303 A1 May 11, 2017

(30) Foreign Application Priority Data
Nov. 11, 2015 (EP) .................................. 15194122

(51) Int. Cl.
| | | |
|---|---|---|
| H01L 29/778 | (2006.01) | |
| H01L 23/552 | (2006.01) | |
| H01L 23/495 | (2006.01) | |
| H01L 23/498 | (2006.01) | |
| H01L 29/78 | (2006.01) | |
| H01L 25/065 | (2023.01) | |
| H01L 29/20 | (2006.01) | |

(52) U.S. Cl.
CPC .......... *H01L 29/778* (2013.01); *H01L 23/495* (2013.01); *H01L 23/552* (2013.01); *H01L 23/49562* (2013.01); *H01L 23/49805* (2013.01); *H01L 25/0655* (2013.01); *H01L 29/2003* (2013.01); *H01L 29/7786* (2013.01);
(Continued)

(58) Field of Classification Search
CPC ... H01L 29/778; H01L 23/495; H01L 23/552; H01L 23/49562; H01L 23/49805; H01L 25/0655; H01L 29/2003; H01L 29/7786; H01L 29/78; H01L 2224/32225; H01L 2224/32245; H01L 2224/48091; H01L 2224/48227; H01L 2224/48237; H01L 2224/48247; H01L 2224/73265;
(Continued)

(56) References Cited

U.S. PATENT DOCUMENTS

| | | | | |
|---|---|---|---|---|
| 5,880,520 | A | * 3/1999 | Ma | ........................ H01L 23/495 257/E23.041 |
| 2006/0261356 | A1* | 11/2006 | Iwakami | ............. H01L 29/7787 257/E29.253 |

(Continued)

FOREIGN PATENT DOCUMENTS

JP 2014099535 A 5/2014

OTHER PUBLICATIONS

Extended European Search Report for Patent Appln. No. 15194122.6 (dated May 23, 2016).
(Continued)

*Primary Examiner* — Su C Kim
(74) *Attorney, Agent, or Firm* — Ruggiero, McAllister & McMahon LLC

(57) ABSTRACT

A semiconductor device and a method of making the same. The device includes a substrate mounted on a carrier, the substrate comprising a High Electron Mobility Transistor (HEMT) having a source, a gate and a drain. The carrier comprises an electrically conductive shielding portion for providing shielding against electromagnetic interference associated with switching of the device during operation. The electrically conductive shielding portion is electrically isolated from the source and from the backside of the substrate.

14 Claims, 4 Drawing Sheets

(52) U.S. Cl.
CPC .... *H01L 29/78* (2013.01); *H01L 2224/32225* (2013.01); *H01L 2224/32245* (2013.01); *H01L 2224/48091* (2013.01); *H01L 2224/48227* (2013.01); *H01L 2224/48237* (2013.01); *H01L 2224/48247* (2013.01); *H01L 2224/73265* (2013.01); *H01L 2924/15313* (2013.01); *H01L 2924/181* (2013.01); *H01L 2924/19107* (2013.01)

(58) Field of Classification Search
CPC ..... H01L 2924/15313; H01L 2924/181; H01L 2924/19107; H01L 29/66431
See application file for complete search history.

(56) References Cited

U.S. PATENT DOCUMENTS

| | | | |
|---|---|---|---|
| 2007/0090502 | A1 | 4/2007 | Zhao et al. |
| 2010/0001291 | A1* | 1/2010 | Otremba ............... H01L 21/561 257/77 |
| 2010/0157568 | A1* | 6/2010 | Ewe .................. H01L 23/49827 361/820 |
| 2011/0101466 | A1* | 5/2011 | Wu ....................... H01L 23/057 257/392 |
| 2011/0233758 | A1* | 9/2011 | Machida ........... H01L 23/49575 257/717 |
| 2014/0175454 | A1* | 6/2014 | Roberts .................. H01L 25/18 257/76 |
| 2015/0279757 | A1* | 10/2015 | Tan ......................... H01L 24/09 257/692 |
| 2018/0047719 | A1* | 2/2018 | Vielemeyer ........... H01L 27/088 |

OTHER PUBLICATIONS

Croon, J. A. et al. "Impact of the backside potential on the current collapse of GaN SBDs and HEMTs", IEEE 27th International Symposium on Power Semiconductor Devices & IC's, pp. 365-368 (2015).

* cited by examiner

SEMICONDUCTOR DEVICE AND A METHOD OF MAKING A SEMICONDUCTOR DEVICE

CROSS-REFERENCE TO RELATED APPLICATIONS

This application claims the priority under 35 U.S.C. § 119 of European Patent application no. 15194122.6, filed on Nov. 11, 2015, the contents of which are incorporated by reference herein.

BACKGROUND

The present specification relates to a semiconductor device, to a method of making a semiconductor device and to a high-side switch including the semiconductor device.

In recent years, GaN/AlGaN High Electron-Mobility Transistors (HEMTs) have drawn a lot of attention regarding their potential to replace Si or SiC for use as high voltage (HV) devices. A GaN/AlGaN HEMT includes a gate, source and drain located on a substrate including GaN layers. The backside of the substrate may be considered as a fourth electrical terminal of the HEMT. The backside of the substrate may be electrically connected to one of the other three terminals.

In order to reduce electromagnetic interference (EMI) during switching, the backside of the substrate may be connected to a non-switching node of the device, since the backside may be considered as a conducting plate that can provide electro-magnetic shielding against the varying electrical potential. The node to which the varying potential is applied generally depends on the application that the HEMT is used in. For instance, when the HEMT is used as a low-side switch in a DC/DC buck converter, the varying potential occurs at the drain. In this case the backside may be connected to the source or the gate. In another example, when the HEMT is used as high-side switch, the varying potential occurs at the source, in which case the backside may be connected to the drain.

Despite the above-noted considerations, the node to which the backside of the substrate is connected is oftentimes determined by factors other than electromagnetic interference. For instance, depletion mode HEMTs have negative threshold-voltage. In order to obtain a positive threshold voltage, the HEMT may be packaged together with a Silicon Metal Oxide Semiconductor Field Effect Transistor (Si MOSFET). In this case the source of the HEMT is typically connected to the backside of the substrate incorporating the HEMT.

A backside-to-drain connection can also have a negative impact on the electrical performance of a HEMT. For instance, the phenomenon known as current collapse may be more prevalent in devices having a backside-to-drain connection compared to devices having a backside-to-source connection.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:

a semiconductor substrate mounted on a carrier, the semiconductor substrate comprising a High Electron Mobility Transistor (HEMT) having a source, a gate and a drain, wherein the carrier comprises an electrically conductive shielding portion for providing shielding against electromagnetic interference associated with switching of the device during operation, and wherein the electrically conductive shielding portion is electrically isolated from the source and from the backside of the substrate.

According to another aspect of the present disclosure, there is provided a method of making a semiconductor device, the method comprising:

providing a substrate comprising a High Electron Mobility Transistor (HEMT) having a source, a gate and a drain; and mounting the substrate on a carrier;

wherein the carrier comprises an electrically conductive shielding portion for providing shielding against electromagnetic interference associated with switching of the device during operation, and wherein the electrically conductive shielding portion is electrically isolated from the source and from the backside of the substrate.

Embodiments of this disclosure may provide shielding against electromagnetic interference produced by the switching of a semiconductor device including a High Electron Mobility Transistor.

The substrate may be a semiconductor substrate. For instance, the substrate may be a silicon substrate, although it is envisaged that other kinds of substrate may be used instead (e.g. a glass, ceramic or other kind of substrate). The substrate may include layers such as an AlGaN layer, a GaN layer, and a number of stress relief layers for reducing stress between the GaN layer and an underlying part of the substrate (which, as noted above, may comprise silicon or some other material.

The switching of the device may be associated with switching of the source or switching of the drain.

The electrically conductive shielding portion may be electrically connected to the drain. This may allow the electrically conductive shielding portion to be held at a steady voltage for effective shielding against electromagnetic interference associated with switching of the source.

The electrically conductive shielding portion may be metallic.

In some examples, the electrically conductive shielding portion may be electrically connected to an external potential. The external potential may, for instance, be ground. This may allow the electrically conductive shielding portion to be held at a steady voltage for effective shielding against electromagnetic interference associated with switching of the source or switching of the drain. In examples in which it is the drain that is the switching node, note that the backside of the substrate, also provides a degree of shielding against electromagnetic interference. It is envisaged that the electrically conductive shielding portion may be electrically connected to an external potential that is separate from the potential applied to the drain, even where the source is the switching node.

The carrier may include a metallic lead frame. In other examples, the carrier may be a dielectric substrate having one or more metal layers. The dielectric substrate may, for instance, comprise a ceramic. Vias filled with an electrically conductive material may pass through the substrate to interconnect metal layers located on an upper and lower surface of the dielectric substrate. The electrically conductive material may comprise a metal. In some examples (e.g. in the case of a ceramic substrate), the electrically conductive material may comprise a sintered paste.

The backside of the substrate may be mounted on a metal layer located on an upper surface of the dielectric substrate and the electrically conductive shielding portion may include one or more metal layers located beneath the upper surface of the dielectric substrate. For instance, the metal layer or layers forming the electrically conductive shielding portion may be located on a lower surface of the dielectric substrate and/or within the dielectric substrate.

The carrier further may include an electrically conductive platform having a surface upon which the backside of the substrate is mounted. This may facilitate electrical connection of the backside to the source (by providing a surface to which both the source and the backside can be electrically connected) while keeping the source and the backside electrically isolated from the electrically conductive shielding portion. The electrically conductive platform may be electrically connected to a source output terminal of the device.

The semiconductor device may be packaged together with a second semiconductor substrate including a Metal Oxide Semiconductor Field Effect Transistor (MOSFET). The MOSFET may be used for operating the High Electron Mobility Transistor in depletion mode. The second semiconductor substrate may be mounted on the electrically conductive platform along with the substrate including the High Electron Mobility Transistor.

The carrier may be a printed circuit board (PCB). The printed circuit board may have one or more patterned metal features located on a surface thereof. One or more of these patterned metal features may form the electrically conductive shielding portion. The patterned metal features may also form an electrically conducting surface upon which the backside of the substrate may be mounted.

The electrically conductive shielding portion may extend at least partially beneath the substrate and/or may extend around a periphery of the substrate, when viewed from above a major surface of the substrate, at least partially to surround the substrate.

The High Electron Mobility Transistor may be a GaN/AlGaN High Electron Mobility Transistor.

The backside of the substrate may be connected to the source of the semiconductor device. Accordingly, embodiments of this disclosure may provide shielding against electromagnetic interference produced by the switching of a semiconductor device including a High Electron Mobility Transistor, even in applications in which the source is connected to the backside of a substrate incorporating the transistor. Since the source is electrically connected to a backside of the substrate, the effect of current collapse may be reduced compared to devices in which the backside is connected to the drain.

In alternative examples, it is envisaged that the backside of the substrate may be electrically connected to the gate or may be left floating. In a further example, the backside of the substrate may be connected to an external potential. A package of the device may include an output terminal to implement the electrical connection of the backside of the substrate to the external potential.

According to a further aspect of the present disclosure, there is provided a high-side switch comprising a semiconductor device of the kind described above.

For the purposes of this dislosure, the electron mobility in a High Electron Mobility Transistor (HEMT) may be in the range 1000-3000 cm^2/V/s or in the range 1000-2000 cm^2/V/s.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Embodiments of this disclosure can provide a semiconductor device that includes a substrate mounted on a carrier. As described in relation to the various embodiments set out below, the carrier may, for instance include an electrically conductive platform, a lead frame, or a metal layer located on a dielectric substrate or printed circuit board. The device may include a High Electron Mobility Transistor (HEMT) having a source, a gate and a drain. In some examples, the source may be connected to the carrier, thereby electrically to connect the source of the HEMT to the backside of the substrate. The carrier may also include an electrically conductive shielding portion for providing shielding against electromagnetic interference associated with switching of the device during operation. The electrically conductive shielding portion may be electrically isolated from the source and from the backside of the substrate. In examples in which the source is connected to the backside of the substrate, the current collapse phenomenon described above may be mitigated.

Figure 1:
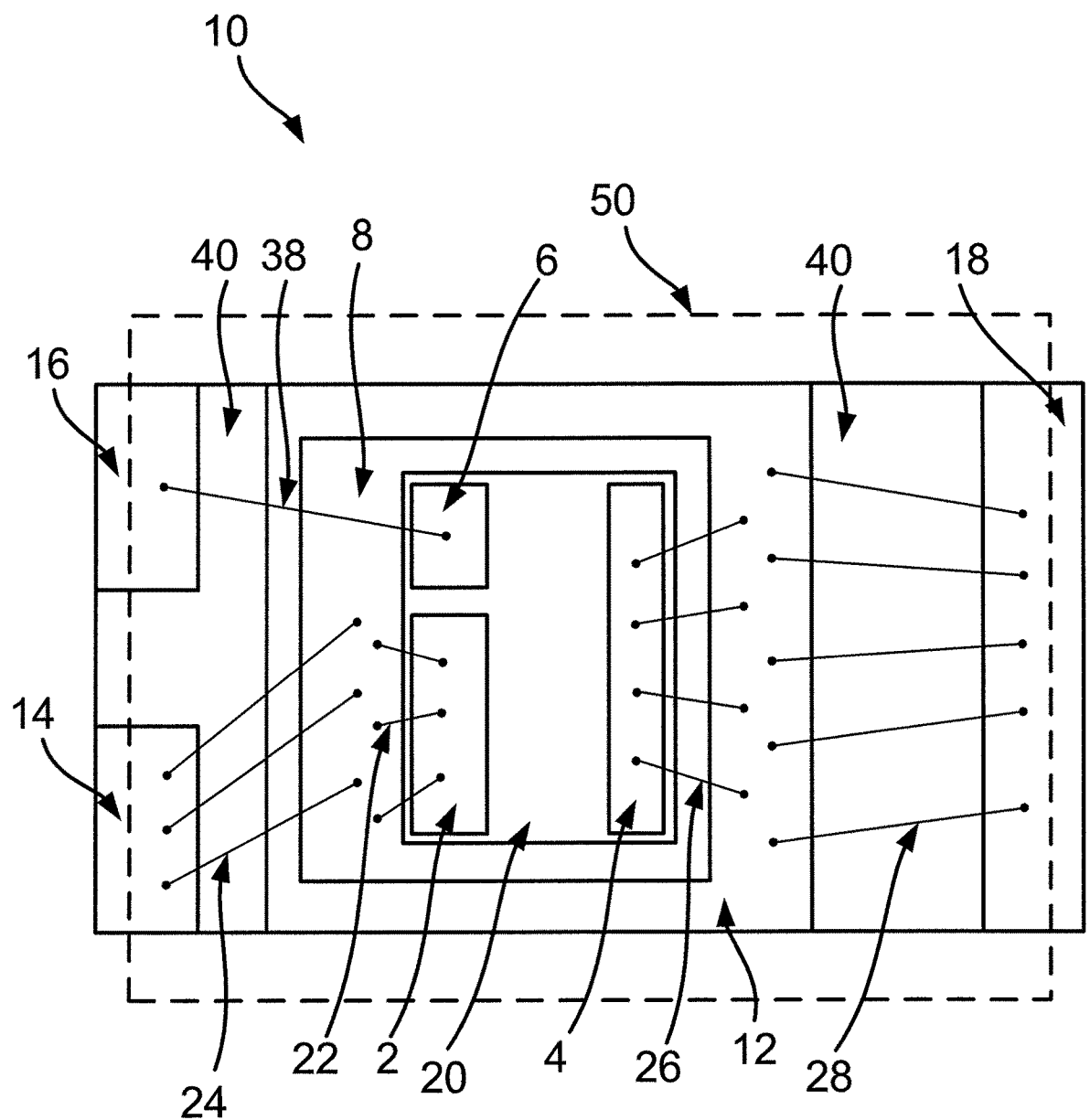
FIG. 1 shows a top view of a semiconductor device according to an embodiment of this disclosure.
Figure 2:
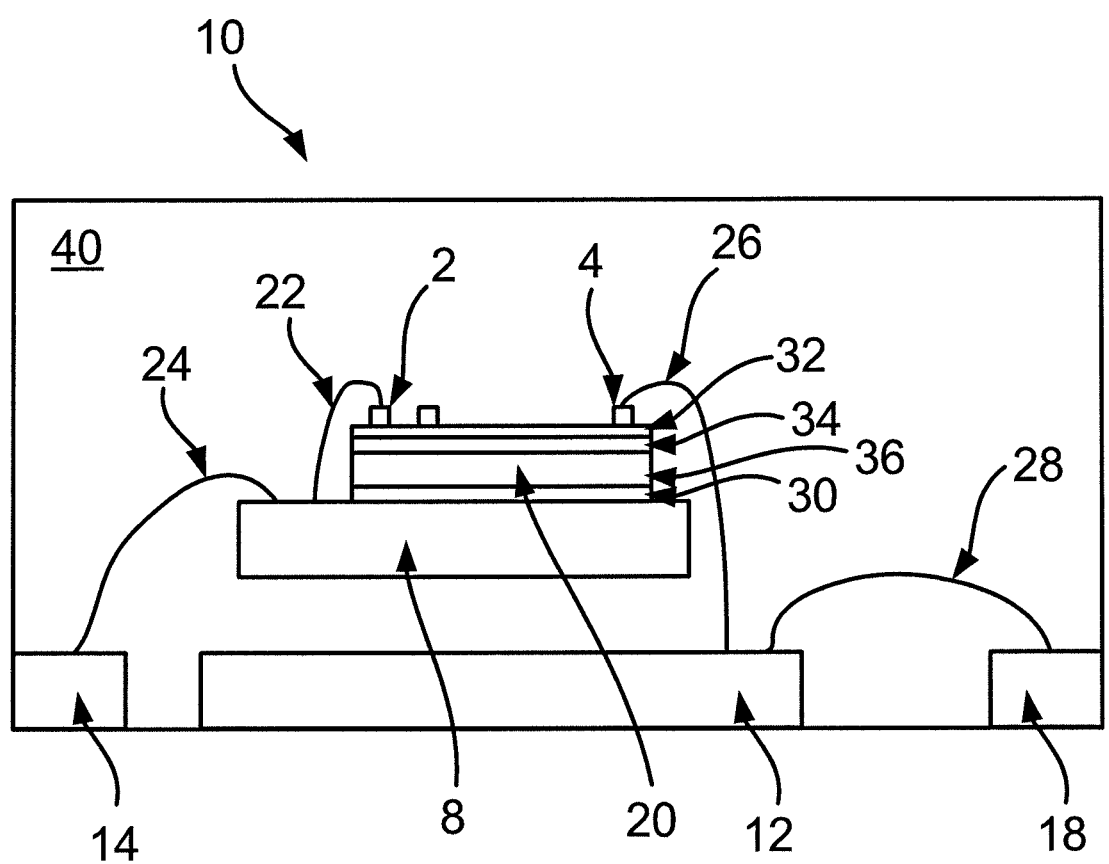
FIG. 2 shows a side view of the semiconductor device of FIG. 1 according to an embodiment of this disclosure.

FIG. 1 shows a top view of a semiconductor device 10 according to a first embodiment of the present disclosure. A side view of the device 10 is shown in FIG. 2.

The device 10 includes a substrate 20, which in this example is a semiconductor substrate comprising e.g. silicon. The semiconductor substrate 20 may include a High Electron Mobility Transistor (HEMT). The HEMT includes a source, a drain, and a gate located in between the source and the drain for modulating the current flow in the device 10. The HEMT may, for instance, be a GaN/AlGaN HEMT. The substrate includes a backside 30, which may for instance comprise silicon. As noted previously, another material such as a glass or a ceramic might be used instead of silicon. The backside 30 may include backside metallization, in some embodiments (not shown in the figures). The substrate may include a plurality of layers such as an AlGaN layer 32, a GaN layer 34, and a number of stress relief layers 36 for reducing stress between the GaN layer 34 and the underlying backside 30. In operation, current within the HEMT is conducted between the source and the drain in the form of a two dimensional electron gas ("2DEG") located at the interface between the AlGaN layer 32 and the GaN layer 34.

The source, drain and gate may be provided on the AlGaN layer 32. The top of the semiconductor substrate 20 may include metallization (not shown in the figures) to connect the source, gate and drain to a source bond pad 2, a gate bond pad 6 and a drain pond pad 4, respectively.

In this example, the semiconductor substrate 20 is provided in a package 50. The package 50 includes a lead frame 12, a source output terminal 14, a gate output terminal 16, a drain output terminal 18 and an electrically conductive platform 8. The semiconductor substrate 20, the lead frame 12, the source output terminal 14, the gate output terminal 16, the drain output terminal 18, the electrically conductive platform 8 and the various bond wires described below may be encapsulated using a mold compound 40. The platform 8 may be located above the lead frame 12. Note that the mold compound 40 may extend between the platform 8 and the lead frame 12, thereby to hold the platform 8 in position and to electrically isolate the platform 8 from the lead frame 12. The source output terminal 14, gate output terminal 16, and drain output terminal 18 may comprise one or more pins that may allow external electrical connections to be made to the source, gate and drain.

In this example, the semiconductor substrate 20 is mounted on the electrically conductive platform 8 such that the backside 30 of the semiconductor substrate 20 is electrically connected to the platform 8. The electrically conductive platform may be metallic, and may comprise the same material as that used to form the lead frame 12.

In the examples described herein in relation to the Figures, bond wires may be used electrically to interconnect features of the device 10, such as the various bond pads and output terminals. It is, however envisaged that in some examples, the lead frame may itself be shaped and configured in such a way to make these connections without the need to provide separate bond wires.

In accordance with embodiments of this disclosure, the backside 30 of the substrate 20 may be electrically connected in a number of alternative ways. For instance, in the examples shown in the Figures of this disclosure, the backside 30 of the substrate 20 is electrically connected to the source bond pad 2. However, it is envisaged that the backside 30 of the substrate 20 may alternatively be electrically connected to the gate of the device 10 or may be left floating. In a further example, the backside 30 of the substrate 20 may be connected to an external potential. A package 50 of the device 10 may include an output terminal to implement the electrical connection of the backside of the substrate to such an external potential.

In the present example, one or more bond wires 22 may connect the source bond pad 2 to the platform 8. In this way, the source of the HEMT may be electrically connected to the backside 30 of the semiconductor substrate 20. In examples in which the backside 30 is left floating, such an electrical connection may be omitted. One or more bond wires 24 may in turn connect the platform to the source output terminal 14. In this way, the source and the backside 30 of the semiconductor substrate 20 may be electrically connected to the source output terminal 14. In examples in which the backside 30 is not connected to the source bond pad 2, the source bond pad may be connected directly to the source output terminal.

One or more bond wires 38 may connect the gate bond pad 6 to the gate output terminal 16. In this way, the gate of the HEMT may be electrically connected to the gate output terminal 16. In examples in which the backside 30 is electrically connected to the gate bond pad 6, the gate bond pad 6 may be connected to the gate output terminal 16 via the platform 8, in much the same way in which the source bond pad 2 is connected to the source output terminal 14 via the platform 8 in the example shown in FIG. 1.

One or more bond wires 26 may connect the drain bond pad 4 to the lead frame 12. One or more bond wires 28 may in turn connect the lead frame 12 to the drain output terminal 18. In this way, the drain of the HEMT may be electrically connected to the drain output terminal 18.

In the present example, the mounting of the semiconductor substrate 20 on the electrically conductive platform 8 may allow the semiconductor substrate 20 to be located in the package 50 such that the source can be connected to the backside 30 and such that a connection can be made to the source output terminal 14 in a manner that is electrically independent of the drain. Accordingly, the source, the platform 8 and the source output terminal 14 may all be electrically isolated from the drain. The mounting of the semiconductor substrate 20 on the platform may also allow the source and the backside 30 to be electrically isolated from an electrically conductive shielding portion of the device.

In the present example, the electrically conductive shielding portion of the device is formed by the lead frame 12. Note that the drain in this example is connected to the electrically conductive shielding portion by the one or more bond wires 26, and that the electrically conductive shielding portion is connected to the drain output terminal 18 by the one or more bond wires 28. In this way, for applications in which the switching in the device 10 takes place at the source, the potential applied to the drain can be used to hold the electrically conductive shielding portion at a steady potential, thereby providing effective shielding against electromagnetic interference caused by the switching.

It is envisaged that the electrically conductive shielding portion may not be connected to the drain or drain output terminal 18. For instance, the device 10 may be provided with a further output terminal for forming an electrical connection to an external potential, such as ground. This can allow the electrically conductive shielding portion to be held at a steady potential, thereby providing effective shielding against electromagnetic interference caused by the switching, in a manner that is independent of the potential applied to the drain. For instance, in cases where the switching in the device 10 is at the source, it may allow the electrically conductive shielding portion to be held at a different potential to that applied to the drain, adding flexibility for optimising the electromagnetic shielding. In other examples, the isolation of the electrically conductive shielding portion from the drain may allow electromagnetic shielding to be provided in applications in which the switching takes place at the drain instead of at the source. Note that in such examples, the backside 30 of the semiconductor substrate 20 and the platform 8 also provide a degree of electromagnetic shielding against any electromagnetic interference associated with switching at the drain.

The electrically conductive shielding portion may be shaped and dimensioned to optimise the electromagnetic shielding that it provides. For instance, in the example of FIGS. 1 and 2, the electrically conductive shielding portion, formed by the lead frame 12, extends beneath the semiconductor substrate 20. As the laterally extent of the lead frame 12 is larger than that of the semiconductor substrate 20, the electrically conductive shielding portion formed by the lead frame 12 in FIGS. 1 and 2 also extends around a periphery of the substrate 20, when viewed from above a major surface of the semiconductor substrate 20, at least partially to surround the substrate. It is envisaged that the electrically conductive shielding portion may not extend completely beneath the substrate as in FIGS. 1 and 2, and it is also envisaged that the electrically conductive shielding portion may also extend only partially around the periphery of the semiconductor substrate 20.

It is envisaged that the device 10 may be packaged together with a second semiconductor substrate including a Metal Oxide Semiconductor Field Effect Transistor (MOSFET). The MOSFET may be used for operating the High Electron Mobility Transistor in depletion mode. The second semiconductor substrate may be mounted on the electrically conductive platform 8 along with the semiconductor substrate 20 including the High Electron Mobility Transistor.

Figure 3:
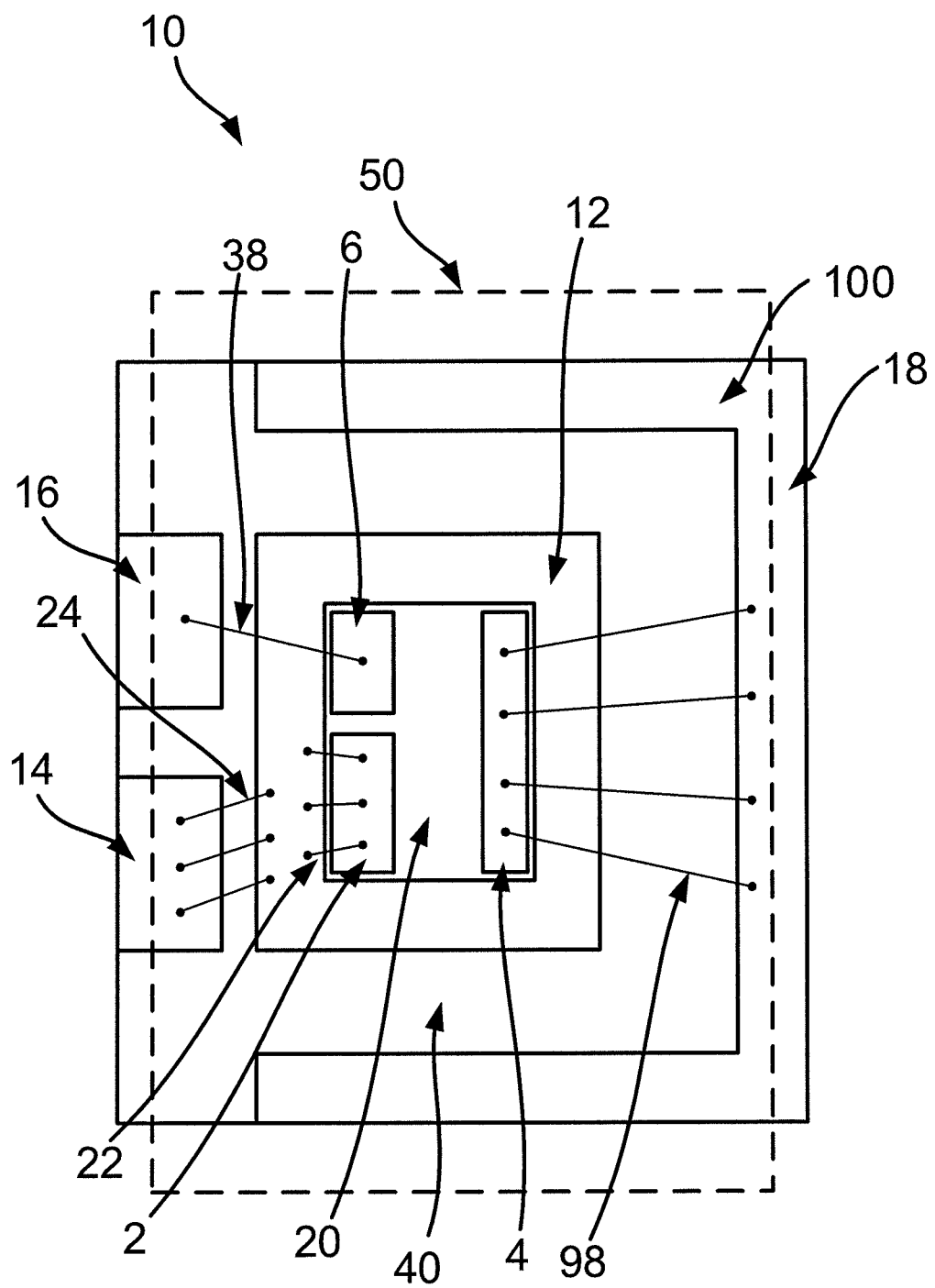
FIG. 3 shows a top view of a semiconductor device according to another embodiment of this disclosure.

FIG. 3 shows a top view of a semiconductor device 10 according to another embodiment of the present disclosure.

The device 10 is provided in a package 50. The device 10 includes a substrate 20, which may be similar to the substrate described above in relation to FIGS. 1 and 2. The device 10 in this example includes a lead frame 12, upon which the semiconductor substrate 20 is mounted, such that the backside of the semiconductor substrate 20 is electrically connected to the lead frame 12. The device of FIG. 3 includes a source output terminal 14 that is connected to the lead frame 12 by one or more bond wires 24. The source bond pad 2 of the semiconductor substrate 20 is also connected to the lead frame 12 by one or more bond wires 22. In this way, the source of the device 10 may be connected to the backside of the substrate and to the source output terminal 14.

The device 10 of FIG. 3 also includes a gate output terminal 16 that is connected to the gate bond pad 6 of the semiconductor substrate 20 by one or more bond wires 38. The device 10 of FIG. 3 also includes a drain output terminal 18, which in this example may be connected to the drain bond pad 4 of the semiconductor substrate 20 by one or more bond wires 98.

The lead frame 12, the semiconductor substrate 20, the source output terminal 14, gate output terminal 16, drain output terminal 18, and the various bond wires of the device and the electrically conductive shielding portion 100 to be described below may be encapsulated using a mold compound 40.

In this example, the electrically conductive shielding portion 100 does not extend beneath the semiconductor substrate 20. The electrically conductive shielding portion 100 in this example extends partially around a periphery of the semiconductor substrate 20, when viewed from above a major surface of the substrate, at least partially to surround the semiconductor substrate 20. In this example, the electrically conductive shielding portion is "C" shaped. Note that the drain output terminal 18 in this example is connected to the electrically conductive shielding portion 100 (the drain output terminal 18 is represented schematically in FIG. 3 by the part of the electrically conductive shielding portion 100 that is located outside the dashed line 50). The electrically conductive shielding portion 100 may be located in the same plane as the lead frame 12 and/or the semiconductor substrate 20 when viewed from the side. Note that the mold compound 40 can electrically isolate the electrically conductive shielding portion from the lead frame 12 and other components of the device 10.

The bond wires 98 described above may connect the drain bond pad 4 to the electrically conductive shielding portion 100, which in turn is connected to the drain output terminal. In this way, the drain may be electrically connected to the drain output terminal 18.

As already discussed in relation to the embodiment of FIGS. 1 and 2, it is also envisaged that the electrically conductive shielding portion 100 may be isolated from the drain and the drain output terminal 18, so that different potentials may be applied to the electrically conductive shielding portion 100 and to the drain. In such examples, the bond wires 98 may connect the drain bond pad 4 directly to the drain output terminal 18, and a separate output terminal may be provided to allow the electrically conductive shielding portion 100 to be connected to an external potential. As previously discussed, this can allow the device 10 to be used in applications in which the switching occurs at the drain and/or provide further electromagnetic shielding (in addition to that provided by the backside of the semiconductor substrate 20 and the lead frame 12) in applications in which the switching occurs at the source.

Again, it is envisaged that the device 10 may be packaged together with a second semiconductor substrate including a Metal Oxide Semiconductor Field Effect Transistor (MOSFET). The MOSFET may be used for operating the High Electron Mobility Transistor in depletion mode. In this example, the second semiconductor substrate may be mounted on the lead frame 12 along with the semiconductor substrate 20 including the High Electron Mobility Transistor.

Figure 4:
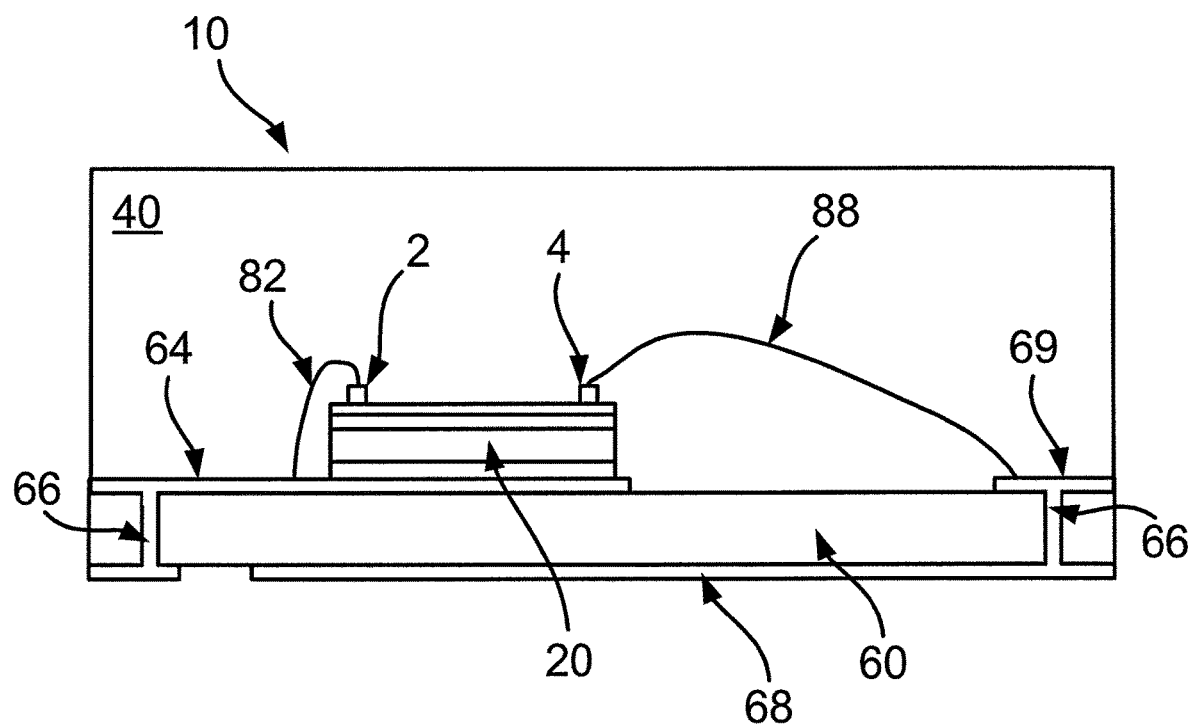
FIG. 4 shows a side view of a semiconductor device according to a further embodiment of this disclosure.

FIG. 4 shows a side view of a semiconductor device 10 according to a further embodiment of the present disclosure. The device 10 includes a substrate 20, which may be similar to the substrate described above in relation to FIGS. 1 to 3.

The device 10 in this example includes a dielectric substrate 60. The dielectric substrate 60 may comprise a ceramic. The dielectric substrate 60 may, for instance, be a thin-film or a thick-film a substrate based on, for example, on aluminium oxide or aluminium nitride. The dielectric substrate 60 may be a laminated substrate, which may have a metal core.

The dielectric substrate 60 may include one or more metal layers, which may be located on the upper and/or lower surfaces of the dielectric substrate 60. One or more metal layers may also be provided inside the dielectric substrate 60. The metal layers may be interconnected by one or more openings 66, such as vias, filled partially or completely with an electrically conductive material. The electrically conductive material may comprise a metal. In some examples (e.g. in the case of a ceramic substrate), the electrically conductive material may comprise a sintered paste.

In the present example, the substrate is mounted on a first metal layer 64, which is located on an upper surface of the dielectric substrate 60. The backside of the substrate is thereby electrically connected to the first metal layer 64. In this example, the source bond pad 2 of the semiconductor substrate 20 is also connected to the first metal layer 64 by one or more bond wires 82. Accordingly, the source of the device 10 is connected to the backside of the semiconductor substrate 20. The first metal layer 64 may be connected to (or may incorporate) a source output terminal of the device 10. In this way, the source of the device 10 may be connected to the source output terminal. One or more bond wires may also connect the gate bond pad of the semiconductor substrate 20 to a gate output terminal of the device (not shown in FIG. 4).

The dielectric substrate 60 in this example is also provided with a second metal layer 68, which forms an electrically conductive shielding portion of the device 10. While the first metal layer 64 is located on the upper surface of the dielectric substrate 60, the second metal layer 68 may be located on a lower surface of the dielectric substrate 60 as shown in FIG. 4, or may be located within the dielectric substrate 60 itself. The conductive shielding portion formed by the second metal layer 68 may be patterned to extend at least partially beneath the semiconductor substrate 20 and/or around a periphery of the substrate, when viewed from above a major surface of the substrate, at least partially to surround the substrate.

As explained previously in relation to the embodiments of FIGS. 1 to 3, a number of options are envisaged, for connecting the electrically conductive shielding portion. In the example shown in FIG. 4, the drain bond pad 4 is connected to a third metal layer 69 on the dielectric substrate 60. The third metal layer 69 may be connected to (or may incorporate) a drain output terminal of the device. The third metal layer may be connected to the second metal layer 68 forming the electrically conductive shielding portion of the device 10 by one or more openings 66, such as vias, filled with conductive material. Accordingly, the second metal layer 68 forming the electrically conductive shielding portion of the device 10 may be connected to the drain. In other examples, the second metal layer 68 forming the electrically conductive shielding portion of the device 10 may be isolated from the drain. For instance, the device 10 may be provided with a separate output terminal for applying an external potential to the electrically conductive shielding portion. As explained previously, this can provide shielding for applications of the device 10 in which the switching occurs at the drain and/or can allow the potential applied to the electrically conductive shielding portion to be chosen independent of the potential applied to the drain (in applications in which the switching occurs at the source), thereby to optimise the electromagnetic shielding that is provided.

Again, it is envisaged that the device 10 may be packaged together with a second semiconductor substrate including a Metal Oxide Semiconductor Field Effect Transistor (MOSFET). The MOSFET may be used for operating the High Electron Mobility Transistor in depletion mode. In this example, the second semiconductor substrate may be mounted on the first metal layer 64 along with the semiconductor substrate 20 including the High Electron Mobility Transistor.

It is envisaged that in a further example of the present disclosure, the carrier may comprise a printed circuit board (PCB). The printed circuit board may have one or more patterned metal features located on a surface thereof. The patterned metal features may form an electrically conducting surface upon which the backside of the substrate may be mounted. A bond wire may be used to connect the source of the device to the electrically conducting surface, thereby to connect the source to the backside of the substrate.

One or more of the patterned metal features on the PCB surface may also form the electrically conductive shielding portion. The patterned metal features may be shaped and dimensioned so that, for instance, the electrically conductive shielding portion extends around a periphery of the substrate, when viewed from above a major surface of the substrate, at least partially to surround the substrate. A bond wire may be used to connect the drain bond pad of the substrate to the patterned metal features forming the electrically conductive shielding portion. Further bond wires may be used to connect the gate bond pad.

A semiconductor device of the kind described herein may be incorporporated into a device such as a high-side switch. The high-side switch may, for instance, be used in power applications using half bridges, such as DC/DC converters (e.g. buck converters and boost converters), motor drivers, other power conversion circuits, and so on.

A method of making a semiconductor device according to an embodiment of this disclosure may include providing a semiconductor substrate including a High Electron Mobility Transistor (HEMT) having a source, a gate and a drain. The method may also include mounting the substrate on a carrier. For instance, this may include mounting the substrate on a platform of the kind described in relation to FIGS. 1 and 2, or on a lead frame of the kind described in relation to FIG. 3, on a metal layer on a surface of a dielectric substrate of the kind described in relation to FIG. 4 or on a metal layer located on the surface of a PCB as described above. The method may also include electrically connecting the source to a backside of the substrate. This may, for instance, be achieved by using a bond wire the connect a source bond pad of the device to the surface upon which the substrate is mounted. As described above, the carrier includes an electrically conductive shielding portion for providing shielding against electromagnetic interference associated with switching of the device during operation. The switching may be at the source or at the drain. The electrically conductive shielding portion is electrically isolated from the source and from the backside of the substrate.

Accordingly, there has been described a semiconductor device and a method of making the same. The device includes a substrate mounted on a carrier, the substrate comprising a High Electron Mobility Transistor (HEMT) having a source, a gate and a drain. The carrier comprises an electrically conductive shielding portion for providing shielding against electromagnetic interference associated with switching of the device during operation. The electrically conductive shielding portion is electrically isolated from the source and from the backside of the substrate.

Although particular embodiments of this disclosure have been described, it will be appreciated that many modifications/additions and/or substitutions may be made within the scope of the claims.

The invention claimed is:

1. A semiconductor device, comprising a substrate mounted on a carrier, the substrate comprising:
   a High Electron Mobility Transistor (HEMT) having a source, a gate, a drain and an electrically conductive backside,
   wherein the carrier comprises an electrically conductive shielding portion configured to provide shielding against electromagnetic interference associated with switching of the semiconductor device during operation and an electrically conductive upper surface,
   wherein the electrically conductive shielding portion is electrically isolated from the source and from an electrically conductive backside of the substrate,
   wherein the electrically conductive backside of the substrate is mounted directly on the electrically conductive upper surface of the carrier; and
   wherein the electrically conductive shielding portion is electrically connected to the drain.

2. The semiconductor device of claim 1, wherein the electrically conductive shielding portion extends at least partially beneath the substrate.

3. The semiconductor device of claim 1, wherein the electrically conductive shielding portion extends around a periphery of the substrate, when viewed from above a major surface of the substrate, to at least partially surround the substrate.

4. The semiconductor device of claim 1, wherein the electrically conductive shielding portion is electrically connected to an external potential.

5. The semiconductor device of claim 1, wherein the carrier comprises a dielectric substrate having one or more metal layers.

6. The semiconductor device of claim 5, wherein the backside of the substrate is mounted on the electrically conductive upper surface of a metal layer located on an upper surface of the dielectric substrate and wherein the electrically conductive shielding portion comprises one or more metal layers located beneath the upper surface of the dielectric substrate.

7. The semiconductor device of claim 1, wherein the carrier comprises a metallic lead frame.

8. The semiconductor device of claim 1, wherein the carrier comprises a printed circuit board having one or more patterned metal features located on a surface of the printed circuit board, wherein at least one of the patterned metal features forms the electrically conductive shielding portion.

9. The semiconductor device of claim 1, wherein the carrier comprises an electrically conductive platform having the electrically conductive upper surface upon which the backside of the substrate is mounted, wherein the source is electrically connected to the electrically conductive platform to electrically connect the source to the backside of the substrate, and wherein the electrically conductive platform is electrically isolated from the electrically conductive shielding portion.

10. The semiconductor device of claim 9, wherein the electrically conductive platform is electrically connected to a source output terminal of the semiconductor device.

11. The semiconductor device of claim 9, further comprising:
   a package for the semiconductor device, and
   a second semiconductor substrate including a Metal Oxide Semiconductor Field Effect Transistor (MOS-FET) packaged together with the semiconductor device, wherein the second semiconductor substrate is also mounted on the electrically conductive platform.

12. The semiconductor device of claim 1, wherein the backside of the substrate is electrically connected to the source.

13. A high-side switch comprising a semiconductor device according to claim 1.

14. A method of making a semiconductor device, the method comprising:
   providing a substrate comprising a High Electron Mobility Transistor having a source, a gate, a drain and an electrically conductive backside; and
   mounting the substrate on a carrier;
   wherein the carrier comprises an electrically conductive shielding portion configured to provide shielding against electromagnetic interference associated with switching of the device during operation and an electrically conductive upper surface,
   wherein the electrically conductive shielding portion is electrically isolated from the source and from an electrically conductive backside of the substrate;
   wherein the electrically conductive backside of the substrate is mounted to the electrically conductive upper surface of the carrier, and
   wherein the electrically conductive shielding portion is electrically connected to the drain.

* * * * *